United States Patent
Hayashi

(10) Patent No.: US 8,638,370 B2
(45) Date of Patent: Jan. 28, 2014

(54) APPARATUS AND METHOD OF PROCESSING SUBSTRATE CONTAINING MARK AND METHOD OF MANUFACTURING DEVICE

(75) Inventor: Nozomu Hayashi, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 326 days.

(21) Appl. No.: 12/788,007

(22) Filed: May 26, 2010

(65) Prior Publication Data

US 2010/0302414 A1 Dec. 2, 2010

(30) Foreign Application Priority Data

May 27, 2009 (JP) ................................. 2009-127144

(51) Int. Cl.
 - *H04N 9/04* (2006.01)
 - *H04N 9/47* (2006.01)
 - *H04N 7/18* (2006.01)
 - *H04N 5/228* (2006.01)
 - *H04N 5/222* (2006.01)

(52) U.S. Cl.
 USPC ................... 348/207.99; 348/87; 348/222.1; 348/371

(58) Field of Classification Search
 USPC ................. 348/87, 207.99, 370–371
 See application file for complete search history.

(56) References Cited

U.S. PATENT DOCUMENTS

| | | | | |
|---|---|---|---|---|
| 5,815,594 A | * | 9/1998 | Tanaka | 382/151 |
| 5,854,745 A | * | 12/1998 | Muraoka et al. | 700/58 |
| 6,621,517 B1 | * | 9/2003 | Squibb | 348/87 |
| 7,342,608 B2 | * | 3/2008 | Yoshida | 348/353 |
| 7,397,602 B2 | * | 7/2008 | Endo | 359/388 |
| 7,619,733 B2 | * | 11/2009 | Matsumoto | 356/318 |
| 2003/0103662 A1 | * | 6/2003 | Finkbeiner | 382/128 |
| 2005/0152029 A1 | * | 7/2005 | Endo | 359/385 |
| 2008/0198368 A1 | * | 8/2008 | Matsumoto | 356/73 |
| 2011/0134235 A1 | * | 6/2011 | Tsumura et al. | 348/87 |

FOREIGN PATENT DOCUMENTS

JP 11-054418 A 2/1999

\* cited by examiner

*Primary Examiner* — Sinh Tran
*Assistant Examiner* — Christopher K Peterson
(74) *Attorney, Agent, or Firm* — Rossi, Kimms & McDowell LLP

(57) ABSTRACT

An apparatus which processes a substrate including a mark to be detected for positioning the substrate, comprises an illuminator configured to illuminate the mark, the illuminator including a shutter which opens and closes an optical path thereof, an image pickup device configured to pick up an image of the mark illuminated by the illuminator, and a storage configured to store correction data for correcting an output of the image pickup device with respect to each of a plurality of illumination periods that depend on operations of the shutter. The apparatus is configured to obtain the correction data from the storage in accordance with the illumination period, and to correct the output of the image pickup device using the obtained correction data.

6 Claims, 3 Drawing Sheets

APPARATUS AND METHOD OF PROCESSING SUBSTRATE CONTAINING MARK AND METHOD OF MANUFACTURING DEVICE

BACKGROUND OF THE INVENTION

1. Field of the Invention

The present invention relates to an apparatus which processes a substrate that includes a mark, and a method of obtaining a position of a mark included in a substrate.

2. Description of the Related Art

Japanese Patent Laid-open No. 11-054418 discloses an alignment method in an exposure apparatus, and more particularly an alignment method for correcting a signal waveform obtained from a surface to be observed (a wafer mark). In addition, Japanese Patent Laid-open No. 11-054418 discloses a method and an apparatus of correcting an illuminance unevenness, a sensitivity unevenness such as a light receiving device or an image pickup device, or a distortion caused by the adhesion of dust or the like, for the signal waveform obtained by illuminating and observing the surface to be observed which is used for an accurate position measurement or the like.

In a previous exposure apparatus, an image pickup device which mounts an electronic shutter was used. Therefore, an illumination time period of illumination light was able to be accurately controlled. However, recently, an image pickup device having a large number of pixels in order to improve the accuracy may be used. The image pickup device having the large number of pixels cannot mount any electronic shutter. In this case, it is necessary to control the illumination time period of the illumination light using a mechanical opening and closing device such as a mechanical shutter.

The mechanical shutter cannot open and close instantly, which is different from the electronic shutter. Therefore, a predetermined driving time period until the mechanical shutter is fully open is necessary, and also the light intensity distribution on the image pickup device is nonuniform until the mechanical shutter is fully open.

FIGS. 4A to 4C are diagrams showing changes of illuminance unevennesses when the illumination time period of the illumination light is changed. FIG. 4A shows a case where the illumination time period is short (a case where a reflectance of the wafer is high), and FIG. 4B shows a case where the illumination time period is long (a case where the reflectance of the wafer is low). FIG. 4C shows illuminance unevennesses A and B in cases of FIGS. 4A and 4B, respectively.

As shown in FIGS. 4A and 4B, when the illumination time period of the illumination light is changed, a ratio of the illumination time period of the illumination light and the driving time period of the mechanical shutter (the shutter) changes. Therefore, the influence of the illuminance unevenness during driving the mechanical shutter varies. Accordingly, as shown in FIG. 4C, the illuminance unevenness in the entire illumination time period of the illumination light also varies. As a result, a signal waveform correcting method using a fixed correction formula for the illumination time period of the illumination light like a previous method, it is difficult to accurately correct the signal waveform.

BRIEF SUMMARY OF THE INVENTION

The present invention provides, for example, an apparatus which is advantageous in terms of correcting of an output of an image pickup device that picks up an image of an illuminated mark.

An apparatus as one aspect of the present invention is an apparatus which processes a substrate including a mark to be detected for positioning the substrate. The apparatus comprises an illuminator configured to illuminate the mark, the illuminator including a shutter which opens and closes an optical path thereof, an image pickup device configured to pick up an image of the mark illuminated by the illuminator, and a storage configured to store correction data for correcting an output of the image pickup device with respect to each of a plurality of illumination periods that depend on operations of the shutter. The apparatus is configured to obtain the correction data from the storage in accordance with the illumination period, and to correct the output of the image pickup device using the obtained correction data.

Further features and aspects of the present invention will become apparent from the following description of exemplary embodiments with reference to the attached drawings.

DETAILED DESCRIPTION OF THE PREFERRED EMBODIMENTS

Figure 1:
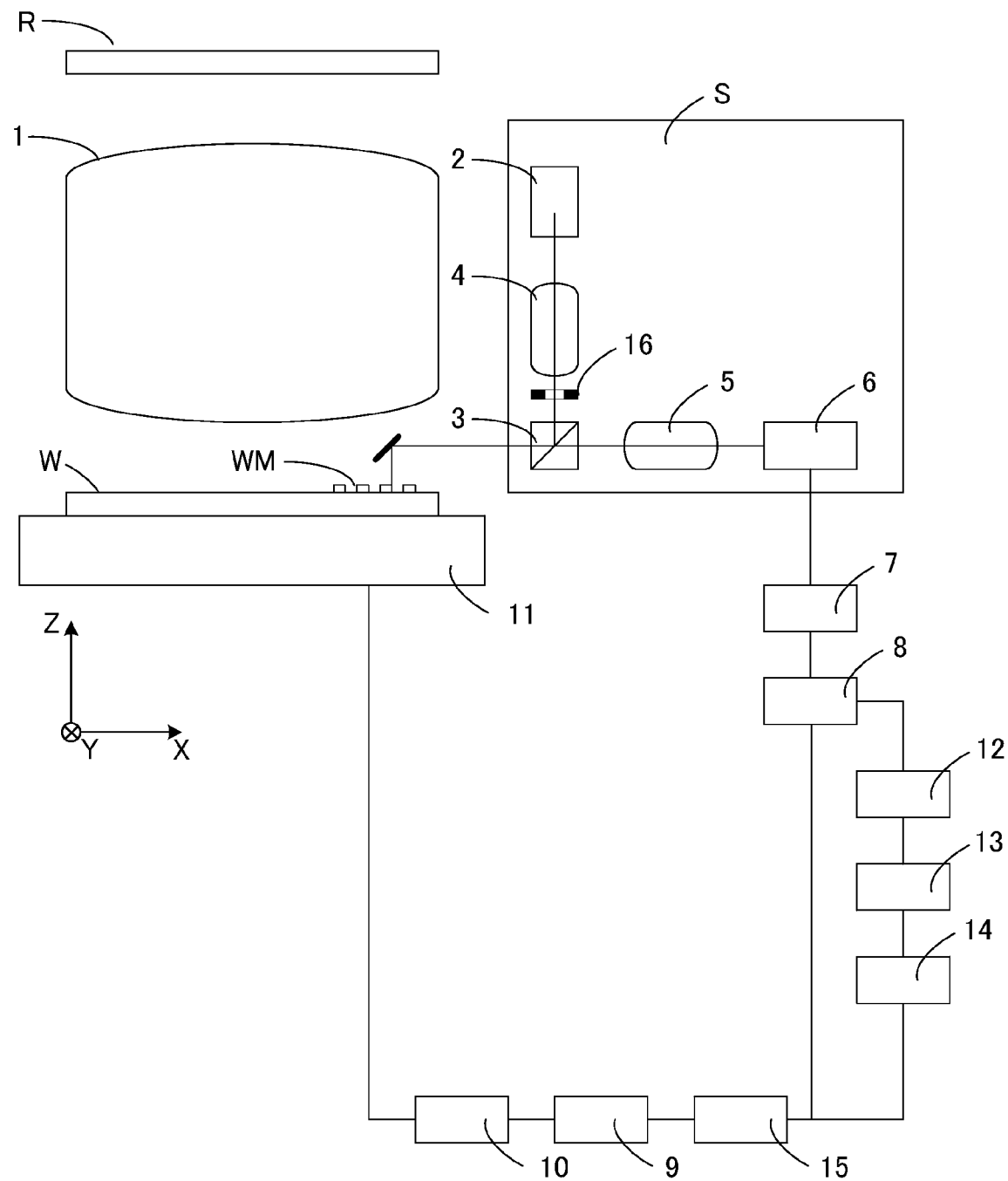
FIG. 1 is a schematic configuration diagram of an exposure apparatus in Embodiment 1.

Exemplary embodiments of the present invention will be described below with reference to the accompanied drawings. In each of the drawings, the same elements will be denoted by the same reference numerals and the duplicate descriptions thereof will be omitted.

Embodiment 1

First, an exposure apparatus (an apparatus) in Embodiment 1 of the present invention will be described. FIG. 1 is a schematic configuration diagram of the exposure apparatus in the present embodiment. The exposure apparatus of the present embodiment performs a method of correcting a signal waveform obtained by observing a surface to be observed (an alignment mark) to expose a substrate using a pattern of an original plate, which is used for manufacturing a device such as a semiconductor.

In FIG. 1, reference symbol R denotes a reticle that is the original plate, reference symbol W denotes a wafer that is the substrate to be exposed, and reference numeral 1 denotes a projection optical system which is used for projecting the pattern formed on the reticle R onto the wafer W. A wafer mark WM (alignment mark) to be detected for positioning the wafer W is provided on the wafer W.

Reference symbol S denotes an alignment measurement optical system, reference numeral 2 denotes an illumination unit (an illuminator) in the alignment measurement optical system S, reference numeral 3 denotes a beam splitter, reference numerals 4 and 5 denote imaging optical systems, reference numeral 6 denotes an image pickup device, and reference numeral 16 denotes a shutter on an illumination optical path (shutter). The illumination unit 2 illuminates the wafer W for the alignment. The image pickup device 6 receives reflected light from the wafer W to form an image. Specifically, the image pickup device 6 forms an image of the wafer mark WM illuminated by the illumination unit 2. The shutter 16 operates so as to open and close an optical path. The shutter 16 may also be configured so as to be included in the illumination unit 2.

The shutter 16 controls an illumination time period of illumination light emitted from the illumination unit 2 for the wafer W. The opening and closing operation of the shutter 16 determines whether the illumination light emitted from the illumination unit 2 is illuminated onto the beam splitter 3 or the transmission of the illumination light to the beam splitter 3 is shielded. Therefore, the operation of the shutter 16 is controlled by a controller (not shown) to be able to change the illumination time period of the illumination light. In the present embodiment, a mechanical shutter is preferably used as the shutter 16, but an electronic shutter may also be used. As shown in FIG. 1, the alignment measurement optical system S is constituted by the illumination unit 2, the beam splitter 3, the imaging optical systems 4 and 5, the image pickup device 6, and the shutter 16.

Reference numeral 7 denotes an A/D converter, reference numeral 8 denotes an accumulator, reference numeral 9 denotes a position detector, reference numeral 10 denotes a stage driving device, and reference numeral 11 denotes an XY stage (a wafer stage) which is two-dimensionally movable in X and Y directions. Reference numeral 12 denotes a reference signal buffer (a temporary memory), reference numeral 13 denotes a correction formula generator, reference numeral 14 denotes a correction formula memory (a storage), and reference numeral 15 denotes a signal correcting device (a correcting device). The reference signal buffer 12, as described below, preserves a plurality of reference signals generated while illumination intensity of the illumination light is changed. The correction formula generator 13 generates a correction formula of a signal waveform using the plurality of reference signals. The correction formula memory 14 stores the correction formula of the signal waveform generated by the correction formula generator 13. Specifically, the correction formula memory 14 stores correction data for correcting an output of the image pickup device 6 with respect to each of a plurality of illumination time periods which are determined by the shutter 16. The signal correcting device 15 corrects the signal waveform using the correction formula (correction data) stored in the correction formula memory 14. Thus, the exposure apparatus of the present embodiment obtains correction data depending on the illumination time period determined by the shutter 16 from the correction formula memory 14 to correct the output of the image pickup device 6 using the obtained correction data.

Next, a correction formula generating procedure in the signal waveform correcting method of the present embodiment will be described. In the present embodiment, the correction formula is generated based on an instruction of a controller (not shown). In the present embodiment, the correction formula is generated by the correction formula generator 13 using a gain A and an offset B obtained for each signal element (pixel x) of the image pickup device 6. A correction value Vx at the pixel x is represented as the following Expression (1) using a gain A(x), an offset B(x), and a luminance value Ix at the pixel x.

$$Vx = A(x) \times Ix + B(x) \qquad (1)$$

When the illumination time period of the illumination light is changed by the shutter 16, the influence of the illuminance unevenness appears in the gain and the offset. Therefore, the gain A and the offset B are respectively represented as functions A(x, t) (a first function) and B(x, t) (a second function) which change depending on the time t as well as the pixel x.

First, the stage driving device 10 moves the XY stage 11 so that the illumination light emitted from the illumination unit 2 is not irradiated onto the wafer mark WM provided on the wafer W, i.e. the illumination light is irradiated onto the wafer W at a position where the wafer mark WM does not exist. Subsequently, while the illumination intensity of the illumination light emitted from the illumination unit 2 is changed, the plurality of reference signals Snt(x) (n=1, 2, ..., N (N: natural number); t=T0, T1, ..., TN) are generated (reference signal generating step). The plurality of reference signals are stored in the reference signal buffer 12.

The correction formula generator 13 generates the correction formula of the signal waveform for each signal element (the pixel x) using the plurality of reference signals stored in the reference signal buffer 12. In this case, the correction formula generator 13 generates a plurality of correction formulas while the shutter 16 changes the illumination time period of the illumination light. In other words, the correction formula generator 13 generates the plurality of correction formulas such as a correction formula applicable to a case where the opening and closing time period of the shutter 16 is short, or a correction formula applicable to a case where the opening and closing time period is long.

The correction formula generated by the correction formula generator 13 is stored in the correction formula memory 14. In other words, the correction formula memory 14 stores the gain A(x, t) and the offset B (x, t) (t=T0, T1, ..., TN) every opening and closing time period of the shutter 16. Thus, the plurality of correction formulas depending on the illumination time period of the illumination light are generated to be stored.

Figure 2A:
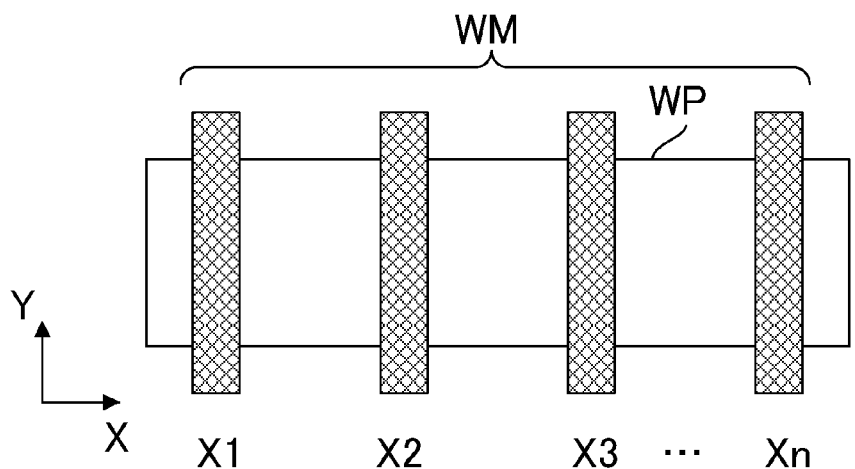
FIGS. 2A and 2B are diagrams showing an example of a wafer mark and a digital signal sequence in Embodiment 1, respectively.

Next, a position operation procedure of the wafer mark WM in the signal waveform correcting method of the present embodiment will be described. First, the shutter 16 is driven by using a controller (not shown), and a light beam (illumination light) emitted from the illumination unit 2 is irradiated onto the wafer mark WM (alignment mark) via the beam splitter 3. FIG. 2A is a diagram showing one example of the wafer mark WM in the present embodiment. The wafer mark WM shown in FIG. 2A is configured by arranging a plurality of rectangular patterns having the same shape. The light beam reflected by the wafer mark WM reaches the beam splitter 3 shown in FIG. 1 again, and forms an image of the wafer mark WM on an image pickup surface of the image pickup device 6 via the imaging optical system 5. The image pickup device 6 performs a photoelectric conversion of the image of the wafer mark WM.

Figure 2B:
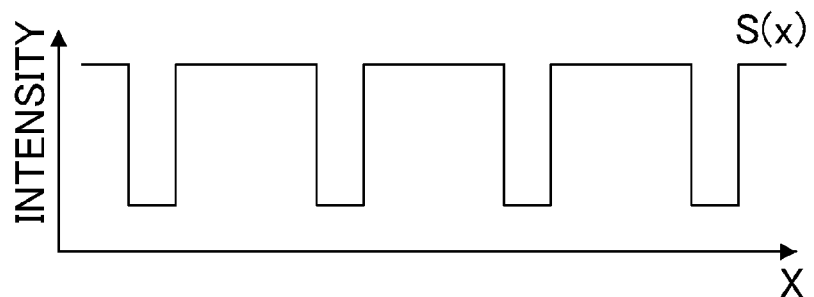

Then, the A/D converter 7 converts an output signal from the image pickup device 6 into a two-dimensional digital signal sequence. The accumulator 8 shown in FIG. 1 performs an accumulation process in a Y direction in a range WP shown in FIG. 2A to convert the two-dimensional digital signal sequence into a one-dimensional digital signal sequence S(x) (x=X1, X2, ..., Xn (n: natural number)). FIG. 2B shows one example of the digital signal sequence S(x) in this case. A vertical axis indicates an intensity of the digital signal sequence S(x) and a horizontal axis indicates a position X in an X-axis direction.

Subsequently, the controller (not shown) opens the shutter 16 and selects one correction formula generated with an illumination time period which is identical with or similar to that of the illumination light (one correction formula which corresponds to the illumination time period) from the correction formula memory 14. When the selected one correction formula is outputted from the correction formula memory 14 to the signal correcting device 15, the signal correcting device 15 corrects the signal waveform using the correction formula to calculate a correction signal sequence (a signal correcting step).

The position detector 9 shown in FIG. 1 obtains a center coordinate position of the wafer mark WM with respect to the one-dimensional correction signal sequence outputted from the signal correcting device 15. The stage driving device 10 drives the XY stage 11 based on the center coordinate position of the wafer mark WM obtained by the position detector 9.

As described above, the correction formula in the present embodiment is different in accordance with the illumination time period of the light (illumination light) illuminating the wafer W that is a surface to be observed. Specifically, the signal correcting step of the present embodiment selects one correction formula which corresponds to a specific illumination time period from a plurality of correction formulas differing in accordance with the illumination time period to correct the signal waveform. Therefore, according to the exposure apparatus of the present embodiment, the illuminance unevenness can be corrected without being influenced by the change in accordance with the illumination time period of the illumination light (the change of the driving time period of the shutter 16).

Embodiment 2

Next, an exposure apparatus (an apparatus) in Embodiment 2 of the present invention will be described. Since the configuration of the exposure apparatus in the present embodiment is the same as that of Embodiment 1, the description of the configuration of the exposure apparatus is omitted. On the other hand, the exposure apparatus of the present embodiment is different from the exposure apparatus of Embodiment 1 regarding a method of obtaining a correction formula with respect to the illumination time period of the illumination light.

The correction formula generating method in Embodiment 1 is a method of previously generating a plurality of correction formulas with respect to different time periods and of selecting a corresponding correction formula out of the plurality of correction formulas. On the other hand, the correction formula generating method in the present embodiment is a method of calculating one correction formula corresponding to an arbitrary illumination time period of the illumination light. In other words, the signal correcting step of the present embodiment substitutes a specific illumination time period into a formula represented by a function of the illumination time period to calculates a correction formula, and corrects a signal waveform using the correction formula. Hereinafter, a signal waveform correcting method in the present embodiment will be described in detail.

Similarly to the case of Embodiment 1, a correction value Vx at a pixel x (a signal element) of the image pickup device 6 is represented as Expression (1) using a gain A(x), an offset B(x), and a luminance value Ix at the pixel x. When the illumination time period of the illumination light is changed by the shutter 16, the influence of the illuminance unevenness appears in the gain and the offset. Therefore, the gain A and the offset B are respectively represented as functions A(x, t) and B(x, t) which change depending on the time t as well as the pixel x.

Figure 3:
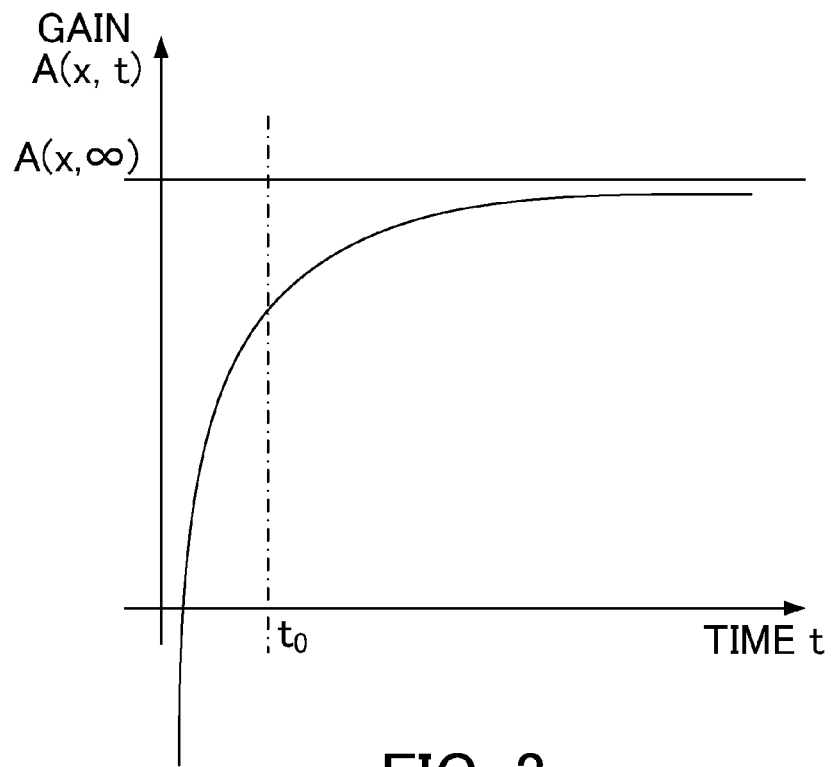
FIG. 3 is a graph showing a time dependency of a gain in Embodiment 1.
Figure 4A:
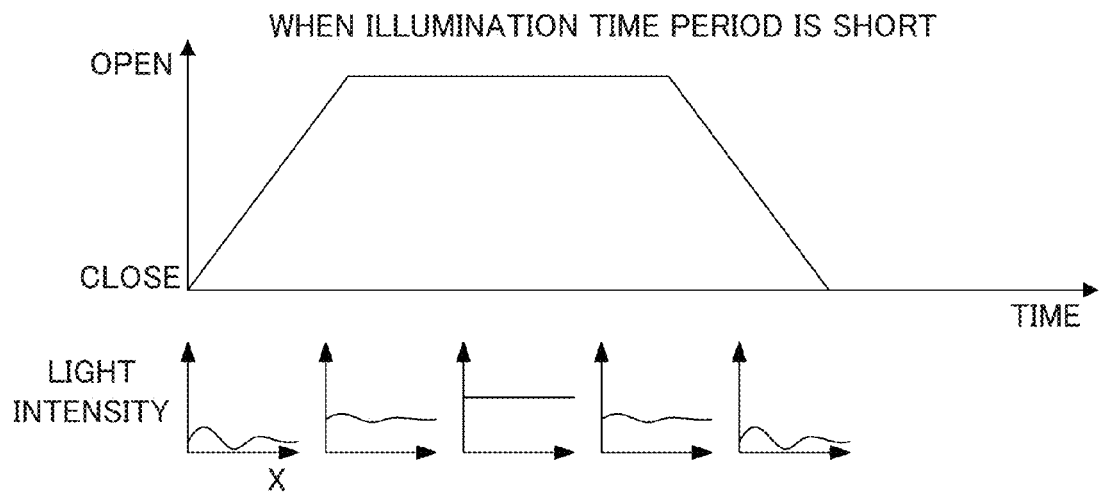
FIGS. 4A to 4C are diagrams showing changes of illuminance unevenness when an illumination time period of illumination light is changed.
Figure 4B:
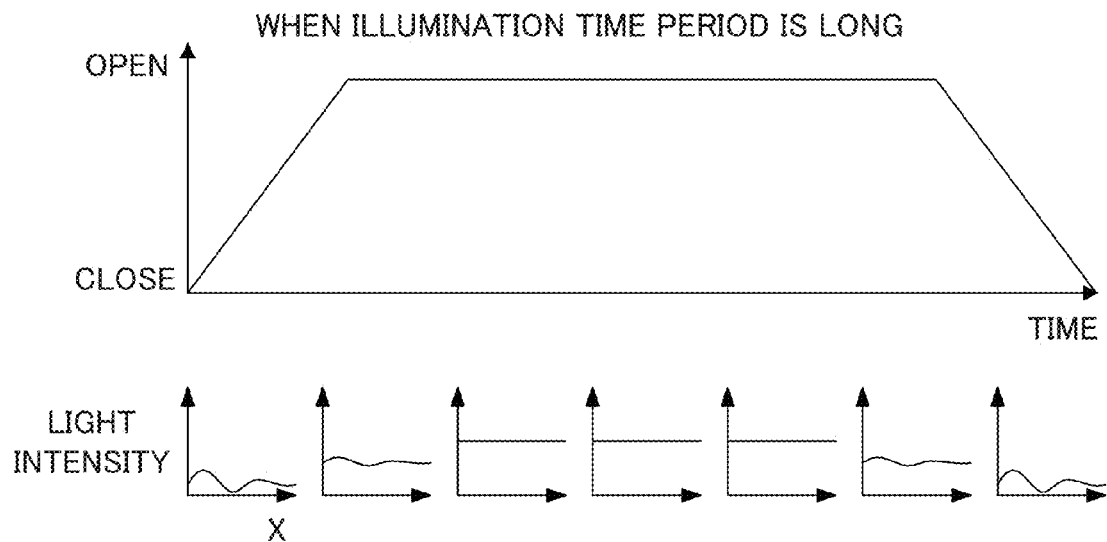
Figure 4C:
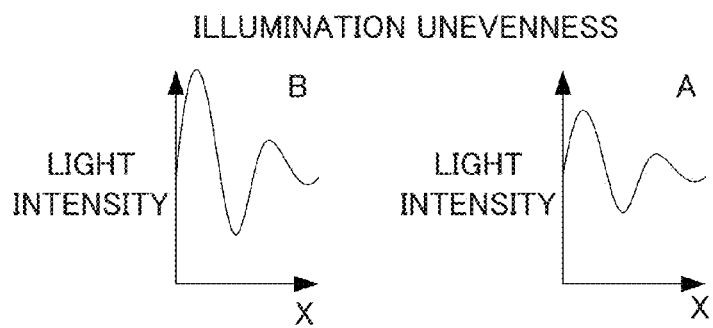

FIG. 3 is a graph showing a time dependency of the gain A in the present embodiment. In FIG. 3, the vertical axis indicates the gain A, and the horizontal axis indicates the time t. Symbol A (x, ∞) on the vertical axis indicates a gain in a case where the illumination time period of the illumination light is infinite (in a case where the illumination time period is extremely long), i.e. an original gain of the pixel x. Symbol $t_0$ on the horizontal axis indicates the shortest illumination time period of the illumination light (the shortest opening and closing time period of the shutter 16). As shown in FIG. 3, the function A(x, t) is a function inversely proportional to the time t. In other words, the function A(x, t) can be represented as the following Expression (2).

$$A(x,t)=A(x,\infty)+C(x)/t \quad (2)$$

In the embodiment, A(x, ∞) and C(x) are previously calculated for each pixel x to be able to obtain the gain function A(x, t) corresponding to an arbitrary illumination time period of the illumination light by Expression (2). When the gain A of each of pixels x=X1, X2, ..., Xn is calculated at the times t=T1, T2 in obtaining A(x, ∞) and C(x), for example the gains A at the pixel X1 are represented as the following Expressions (3) and (4).

$$A(X1,T1) \times T1 = A(X1,\infty) \times T1 + C(X1) \quad (3)$$

$$A(X1,T2) \times T2 = A(X1,\infty) \times T2 + C(X1) \quad (4)$$

When the above Expressions (3) and (4) are solved as a simultaneous equation, C(x) and A(x, ∞) are represented as the following Expressions (5) and (6), respectively.

$$C(X1)=T1 \cdot T2[A(X1,T1)-A(X1,T2)]/(T2-T1) \quad (5)$$

$$A(X1,\infty)=[A(X1,T2) \cdot T1 - A(X1,T1) \cdot T2]/(T2-T1) \quad (6)$$

The gain A of each of the pixels x=X2, X3, ..., Xn can also be obtained by the same method as that of the above pixel x=X1.

Similarly to the gain function A(x, t), the offset function B(x, t) is represented as the following Expression (7).

$$B(x,t)=B(x,\infty)+D(x)/t \quad (7)$$

B(x,∞) and D(x) are previously calculated for each pixel x to be able to obtain the offset function B(x, t) corresponding to an arbitrary illumination time period of the illumination light by using Expression (7). In obtaining B(x, ∞) and D(x), the offset of each of the pixels x=X1, X2, ..., Xn is calculated at the times t=T1, T2. In this case, for example the offsets B at the pixel X1 are represented as the following Expressions (8) and (9).

$$B(X1,T1) \times T1 = B(X1,\infty) \times T1 + D(X1) \quad (8)$$

$$B(X1,T2) \times T2 = B(X1,\infty) \times T2 + D(X1) \quad (9)$$

When the above Expressions (8) and (9) are solved as a simultaneous equation, D(x) and B(x, ∞) are represented as the following Expressions (10) and (11), respectively.

$$D(X1)=T1T2[B(X1,T1)-B(X1,T2)]/(T2-T1) \quad (10)$$

$$B(X1,\infty)=[B(X1,T2) \cdot T1 - B(X1,T1) \cdot T2]/(T2-T1) \quad (11)$$

The offset B of each of the pixels x=X2, X3, ..., Xn can also be obtained by the same method as that of the above pixel x=X1.

A(x, ∞), C(x), B(x, ∞), and D(x) (x=X1, X2, ..., Xn) obtained as described above are stored in the correction formula memory 14. Therefore, at the time of measuring the wafer mark WM, the specific gain A and offset B corresponding to the illumination time period t of the illumination light can be calculated based on the above Expressions (2) and (7), respectively. According to the exposure apparatus of the present embodiment, the illuminance unevenness can be corrected without being influenced by the change by the illumination time period of the illumination light (the change of the driving time of the shutter 16).

In the present embodiment, $A(x, \infty)$, $C(x)$, $B(x, \infty)$, and $D(x)$ are obtained from the gains and the offsets calculated using two illumination times $t=T1$, $T2$, but the present embodiment is not limited to this. In order to obtain a more accurate value, $A(x, \infty)$, $C(x)$, $B(x, \infty)$, and $D(x)$ may also be obtained by the method of least squares using gains and offsets of three or more illumination times $t=T1$, $T2$, $T3, \ldots, Tn$ ($n \geq 3$).

According to each of the above embodiments, since a correction formula depending on an illumination time period of illumination light is generated to correct a signal waveform using the correction formula, illuminance unevenness can be accurately corrected even if the illumination time period of illuminating an alignment mark is changed. Therefore, according to each of the above embodiments, an exposure apparatus capable of performing a highly-accurate alignment process can be provided. In addition, a signal waveform correcting method capable of the alignment process can be provided.

A device (a semiconductor integrated circuit device, a liquid crystal display device, or the like) is manufactured by a process of exposing a substrate (a wafer, a glass plate, or the like) which is coated by a photosensitizing agent using an exposure apparatus in any one of the above embodiments, a process of developing the substrate, and other well-known processes. According to the present embodiment, a method of manufacturing a high-quality device can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-127144, filed on May 27, 2009, which is hereby incorporated by reference herein in its entirety.

What is claimed is:

1. An apparatus for processing a substrate, including a mark to be detected for positioning the substrate, the apparatus comprising:
   an illuminator configured to illuminate the mark, the illuminator including a shutter, which opens and closes an optical path thereof, and determine an illumination period during which the mark is to be illuminated;
   an image pickup device configured to pick up an image of the mark illuminated by the illuminator; and
   a storage device configured to store correction data for correcting, regarding an illuminance unevenness of the illuminator that depends on the illumination period, an output of the image pickup device with respect to each of a plurality of illumination periods,
   wherein the apparatus is configured to obtain the correction data from the storage device in accordance with the illumination period, and to correct the output of the image pickup device using the obtained correction data, and
   wherein the storage device is configured to store, as the correction data for each pixel of the image pickup device, a coefficient of a first-order term and a coefficient of a zeroth-order term of a linear function of the output with respect to each of the plurality of illumination periods.

2. An apparatus according to claim 1, wherein the apparatus is configured to cause the image pickup device to perform a pickup of an image for a region on the substrate where the mark does not exist with respect to each of the plurality of illumination periods, and to obtain the correction data based on the data obtained by the pickups.

3. An apparatus for processing a substrate, including a mark to be detected for positioning the substrate, the apparatus comprising:
   an illuminator configured to illuminate the mark, the illuminator including a shutter, which opens and closes an optical path thereof, and determine an illumination period during which the mark is to be illuminated;
   an image pickup device configured to pick up an image of the mark illuminated by the illuminator; and
   a storage device configured to store correction data for correcting, regarding an illuminance unevenness of the illuminator that depends on the illumination period, an output of the image pickup device with respect to each of a plurality of illumination periods,
   wherein the apparatus is configured to obtain the correction data from the storage device in accordance with the illumination period, and to correct the output of the image pickup device using the obtained correction data, and
   wherein the storage device is configured to store, as the correction data for each pixel of the image pickup device, data which specify a first function and a second function as functions of the illumination period, the first function and the second function providing a coefficient of a first-order term and a coefficient of a zeroth-order term of a linear function of the output, respectively.

4. An apparatus according to claim 3, wherein the apparatus is configured to cause the image pickup device to perform a pickup of an image for a region on the substrate where the mark does not exist with respect to each of the plurality of illumination periods, and to obtain the correction data based on the data obtained by the pickups.

5. A method of obtaining a position of a mark included in a substrate, the method comprising:
   a correction data obtaining step of obtaining correction data;
   an illuminating step of illuminating the mark with an illuminator via a shutter which opens and closes an optical path thereof, and determining an illumination period during which the mark is to be illuminated;
   a pickup step of picking up an image of the illuminated mark using an image pickup device;
   a correcting step of correcting an output of the image pickup device using the correction data corresponding to the illumination period; and
   a position obtaining step of obtaining the position of the mark based on data obtained in the correcting step,
   wherein the correction data obtaining step comprises:
   (a) causing the image pickup device to pick up an image for a region on the substrate where the mark does not exist with respect to each of a plurality of illumination periods; and
   (b) obtaining the correction data for correcting, regarding an illuminance unevenness of the illuminator that depends on the illumination period, an output of the image pickup device with respect to each of the plurality of illumination periods based on the image obtained in (a),
   wherein the correction data for each pixel of the image pickup device includes a coefficient of a first-order term and a coefficient of a zeroth-order term of a linear function of the output with respect to each of the plurality of illumination periods.

6. A method of obtaining a position of a mark included in a substrate, the method comprising:

a correction data obtaining step of obtaining correction data;

an illuminating step of illuminating the mark with an illuminator via a shutter which opens and closes an optical path thereof, and determining an illumination period during which the mark is to be illuminated;

a pickup step of picking up an image of the illuminated mark using an image pickup device;

a correcting step of correcting an output of the image pickup device using the correction data corresponding to the illumination period; and a position obtaining step of obtaining the position of the mark based on data obtained in the correcting step, wherein the correction data obtaining step comprises:

(a) causing the image pickup device to pick up an image for a region on the substrate where the mark does not exist with respect to each of a plurality of illumination periods; and (b) obtaining the correction data for correcting, regarding an illuminance unevenness of the illuminator that depends on the illumination period, an output of the image pickup device with respect to each of the plurality of illumination periods based on the image obtained in (a), wherein the correction data for each pixel of the image pickup device specifies a first function and a second function as functions of the illumination period, the first function and the second function providing a coefficient of a first-order term and a coefficient of a zeroth-order term of a linear function of the output, respectively.

* * * * *